United States Patent [19]
Ichikawa et al.

[11] Patent Number: 5,416,667
[45] Date of Patent: May 16, 1995

[54] PRINTED WIRING BOARD HAVING AN ELECTROMAGNETIC WAVE SHIELDING LAYER

[75] Inventors: Junichi Ichikawa; Katsutomo Nikaido; Shin Kawakami, all of Iruma, Japan

[73] Assignee: Nippon CMK Corp., Japan

[21] Appl. No.: 87,848

[22] Filed: Jul. 2, 1993

[30] Foreign Application Priority Data

Jul. 3, 1992 [JP] Japan .............................. 4-052812 U

[51] Int. Cl.⁶ .......................... H05K 1/02; H05K 3/00
[52] U.S. Cl. .................... 361/816; 174/35 R; 174/250; 174/255; 361/748; 29/830
[58] Field of Search ...................... 174/250, 255, 31 R; 361/748, 816; 29/830

[56] References Cited

U.S. PATENT DOCUMENTS

| | | | |
|---|---|---|---|
| 5,025,116 | 6/1991 | Kawakami et al. | 174/250 |
| 5,112,648 | 5/1992 | Okonogi et al. | 427/96 |
| 5,236,736 | 8/1993 | Kawakami et al. | 427/96 |
| 5,262,596 | 11/1993 | Kawakami et al. | 174/261 |
| 5,270,493 | 12/1993 | Inoue et al. | 174/253 |

*Primary Examiner*—Leo P. Picard
*Assistant Examiner*—L. Thomas
*Attorney, Agent, or Firm*—Adams & Wilks

[57] ABSTRACT

A printed wiring board comprises a substrate, a printed wiring circuit formed on the substrate, and insulating layer formed on the printed wiring circuit, an electromagnetic wave shielding layer provided on the insulating layer, and an overcoat layer provided on the electromagnetic shielding layer. The electromagnetic shielding layer has a first color, and the overcoat layer has a second color different from the first color. The color of the overcoat layer may be any color which is easily visually distinguishable from the color of the electromagnetic wave shielding layer so that visual inspection of the working condition of the overcoat layer is facilitated.

20 Claims, 2 Drawing Sheets

PRINTED WIRING BOARD HAVING AN ELECTROMAGNETIC WAVE SHIELDING LAYER

BACKGROUND OF THE INVENTION

1. Field of the Invention

The present invention relates to a printed wiring board having an electromagnetic wave shielding layer and, more particularly, to single-sided, double-sided or multilayered printed wiring boards having an electromagnetic wave shielding layer.

2. Description of the Related Art

Recently, with the advent of advances in electronic apparatus and appliance technology, and further advances in electronic apparatuses and appliances are hindered due to electromagnetic waves causing more smog and destroying the electronics environment. The electromagnetic interference to electric apparatuses and appliances has also become an important problem.

As a countermeasure for electromagnetic interference, in order to prevent erroneous operation of a circuit due to electromagnetic waves between circuits of conventional printed wiring boards or between outer apparatuses and appliances and the circuit of conventional printed wiring boards, an electromagnetic wave shielding layer is conventionally provided on the whole surface or required portion of the printed wiring circuit through an insulating layer, thereby shielding the electromagnetic wave.

An overcoat layer for guarding the printed wiring circuit is, then, provided on the electromagnetic wave shielded wiring board as an outermost layer. This overcoat layer is formed by using green ink.

Conventionally, an analysis of working condition of the printed wiring board or the insulating layer can be conducted by an electric checker. However, the working condition of the overcoat layer is generally dependent on a visual inspection.

Ink used for the outermost overcoat as outermost layer of the conventional printed wiring board is a thermosetting ink having a comparatively dark green color. As a result the color difference between a green electromagnetic shielding layer of copper paste and the green overcoat layer is very small. Thus, it is difficult to distinguish between the electromagnetic shielding layer and the outermost overcoat layer due to such a lack of color difference and to detect a thin spot in the electromagnetic shielding layer.

Generally, the inks (under resist) used for the insulating layer is also green, in addition to the green overcoat, so that it is difficult to detect blurring of the ink.

SUMMARY OF THE INVENTION

It is an object of the present invention to eliminate the above disadvantages in conventional printed wiring boards having electromagnetic wave shielding layers.

It is another object of the present invention to provide a printed wiring board having an electromagnetic wave shielding layer in which the working condition of an overmost overcoat layer is capable of being easily detected by visual inspection.

According to an aspect of the present invention, a printed wiring board comprises a base material, a pattern of printed wiring circuit laminated on one or both surface(s) of the base material and consisting of a conductor, an insulating layer provided on the printed wiring circuit, an electromagnetic wave shielding layer provided on the whole surface or a required portion of the printed wiring circuit through the insulating layer, and an overcoat layer provided on the electromagnetic wave shielding layer and the printed wiring circuit as an outermost layer, the overcoat layer being colored red.

According to the printed wiring board having an electromagnetic wave shielding layer of the present invention, the color of the overcoat is red, so that it is clearly possible to distinguish the colors between the overcoat layer, and the insulating layer or electromagnetic wave shielding layer. Thus, it becomes possible to identify the working condition of the overcoat layer easier by visual inspection.

BRIEF DESCRIPTION OF THE DRAWINGS

The invention will now be described in more detail the following description of the figures, in which.

Figure 1:
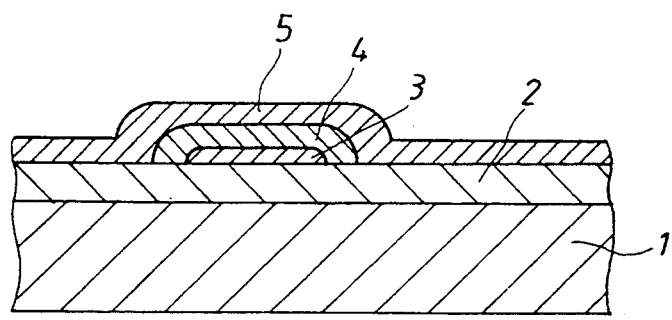
FIG. 1 is a cross-sectional view showing one embodiment of a printed wiring board having an electromagnetic wave shielding layer according to the present invention.
Figure 2:
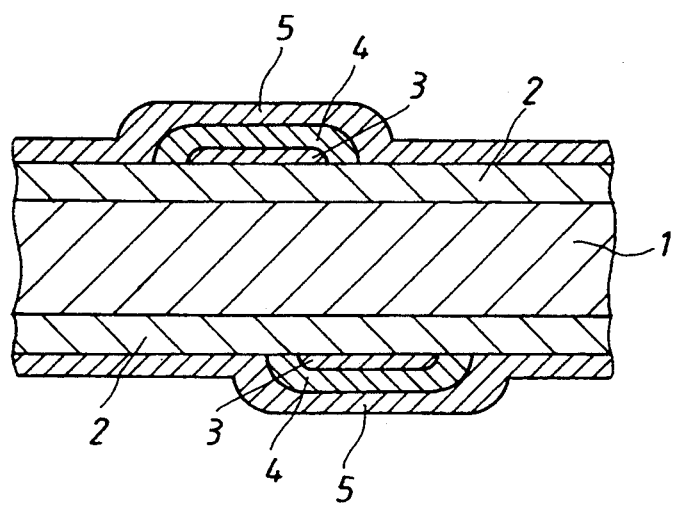
FIG. 2 is a cross-sectional view showing another embodiment of a printed wiring board having an electromagnetic wave shielding layer according to the present invention.

The printed wiring board comprises a printed basic substrate 1 (for example, a copper clad laminate), a pattern of printed wiring circuits 2 provided on one (FIG. 1) or both (FIG. 2) surfaces of the basic substrate 1 by a conventional method, an insulating layer 3 provided on the printed wiring circuit, and an electromagnetic wave shielding layer 4 provided on a required portion or on the whole surface of the printed wiring circuit 2 through the insulating layer The printed wiring board further comprises a red overcoat layer 5 provided on the electromagnetic wave shielding layer 4 on the whole surface or a part thereof of the printed wiring circuit 2 as an outermost layer of the printed wiring board to protect the electromagnetic shielding layer.

According to the printed wiring board with the above described construction, the electromagnetic wave shielding layer 4 and the insulating layer 3 are green and the overcoat layer 5 is red, so that it becomes possible to distinguish between the colors of the overcoat layer 5 and the insulating layer 3 or the electromagnetic wave shielding layer 4. Thus, it is possible to easily detect a thin spot or the like of the overcoat layer 5 by visual inspection as well as easily read characters printed on the overcoat layer.

The shielded portion of the printed wiring circuit 2 can clearly be recognized to be more dark green than the other circuit portions. The shielded portion can therefore be easily recognized and, it thus becomes possible to distinguish between conventional single-sided or double-sided printed wiring boards and a printed wiring board having an electromagnetic wave shielding layer 4 according to the present invention.

As the color of the overcoat layer 5, any color other than red may be used so long as it is easily possible to distinguish the color as compared with the green color of the electromagnetic wave shielding layer 4 and the insulating layer 3.

What is claimed is:

1. A printed wiring board comprising: a substrate having a main surface; a printed wiring circuit disposed on the main surface of the substrate; an insulating layer disposed on the printed wiring circuit; an electromagnetic wave shielding layer provided on the insulating layer and having a first color; and an overcoat layer provided on the electromagnetic shielding layer and having a second color which is visually distinguishable from said first color.

2. A printed wiring board as claimed in claim 1; wherein the insulating layer also has the first color.

3. A printed wiring board as claimed in claim 1; wherein the first color is green and the second color is red.

4. A printed wiring board as claimed in claim 1; wherein the second color is red.

5. A printed wiring board as claimed in claim 1; wherein the electromagnetic shielding layer is provided on a portion of the printed wiring circuit.

6. A printed wiring board as claimed in claim 5; wherein the first color is green and the second color is red.

7. A printed wiring board as claimed in claim 1 wherein the electromagnetic shielding layer is provided on the entire printed wiring circuit.

8. A printed wiring board as claimed in claim 7; wherein the first color is green and the second color is red.

9. A printed wiring board comprising: a substrate having upper and lower surfaces; a printed wiring circuit formed on each of the upper and lower surfaces of the substrate; an insulating layer formed on each of the printed wiring circuits; an electromagnetic wave shielding layer provided on each of the insulating layers and having a first color; and an overcoat layer provided on each of the electromagnetic wave shielding layers and having a second color which is visually distinguishable from the first color.

10. A printed wiring board as claimed in claim 8; wherein the insulating layers also have the first color.

11. A printed wiring board as claimed in claim 9; wherein the first color is green and the second color is red.

12. A printed wiring board as claimed in claim 9; wherein the second color is red.

13. A printed wiring board as claimed in claim 9; wherein each electromagnetic shielding layer is provided on a portion of the respective printed wiring circuit.

14. A printed wiring board as claimed in claim 13; wherein the first color is green and the second color is red.

15. A printed wiring board as claimed in claim 9; wherein each shielding layer is provided on the entire respective printed wiring circuit.

16. A printed wiring board as claimed in claim 15; wherein the first color is green and the second color is red.

17. A method of manufacturing a printed wiring board, comprising the steps of: providing a substrate having upper and lower surfaces; forming a printed wiring circuit on at least one surface of the substrate; forming an insulating layer on the printed wiring circuit; forming an electromagnetic wave shielding layer having a first color on the insulating layer; and forming an overcoat layer having a second color which is visually distinguishable from the first color on the electromagnetic shielding layer.

18. A method of manufacturing a printed wiring board as claimed in claim 17; wherein the first color is green and the second color is red.

19. A method of manufacturing a printed wiring board as claimed in claim 17; wherein the second color is red.

20. A method of manufacturing a printed wiring board as claimed in claim 17; wherein the insulating layer also has the first color.

* * * * *